(12) United States Patent  
Mokhlesi

(10) Patent No.: US 7,800,161 B2
(45) Date of Patent: Sep. 21, 2010

(54) FLASH NAND MEMORY CELL ARRAY WITH CHARGE STORAGE ELEMENTS POSITIONED IN TRENCHES

(75) Inventor: Nima Mokhlesi, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/614,909

(22) Filed: Dec. 21, 2006

(65) Prior Publication Data

US 2008/0149996 A1    Jun. 26, 2008

(51) Int. Cl.
*H01L 27/115*    (2006.01)

(52) U.S. Cl. .................. 257/319; 257/316; 257/321; 257/E27.103; 438/700; 365/185.01

(58) Field of Classification Search .................. 257/315, 257/316, 321, 319, E27.103; 438/700; 365/189.01, 365/89.011
See application file for complete search history.

(56) References Cited

U.S. PATENT DOCUMENTS

| | | | |
|---|---|---|---|
| 4,622,656 A | 11/1986 | Kamiya et al. | |
| 5,043,940 A | 8/1991 | Harari | |
| 5,070,032 A | 12/1991 | Yuan et al. | |
| 5,095,344 A | 3/1992 | Harari | |
| 5,172,338 A | 12/1992 | Mehrotra et al. | |
| 5,297,148 A | 3/1994 | Harari et al. | |
| 5,313,421 A | 5/1994 | Guterman et al. | |
| 5,315,541 A | 5/1994 | Harari et al. | |
| 5,331,189 A * | 7/1994 | Chan et al. .................. 257/321 |
| 5,343,063 A | 8/1994 | Yuan et al. | |
| 5,371,704 A | 12/1994 | Okazawa | |
| 5,570,315 A | 10/1996 | Tanaka et al. | |
| 5,656,544 A | 8/1997 | Bergendahl et al. | |
| 5,661,053 A | 8/1997 | Yuan | |
| 5,705,415 A | 1/1998 | Orlowski et al. | |
| 5,712,180 A | 1/1998 | Guterman et al. | |
| 5,774,397 A | 6/1998 | Endoh et al. | |
| 5,786,612 A | 7/1998 | Otani et al. | |
| 5,874,760 A * | 2/1999 | Burns et al. .................. 257/315 |
| 5,887,145 A | 3/1999 | Harari et al. | |
| 5,973,356 A | 10/1999 | Noble et al. | |
| 5,998,261 A | 12/1999 | Hofmann et al. | |
| 6,046,935 A | 4/2000 | Takeuchi et al. | |
| 6,103,573 A | 8/2000 | Harari et al. | |
| 6,118,147 A | 9/2000 | Liu | |
| 6,124,608 A | 9/2000 | Liu et al. | |
| 6,133,098 A | 10/2000 | Ogura et al. | |
| 6,151,248 A | 11/2000 | Harari et al. | |

(Continued)

OTHER PUBLICATIONS

Plummer, Silicon VLSI Technology Fundamentals, Practice and Modeling, 2000, Prentice Hall, p. 611.*

(Continued)

*Primary Examiner*—Kiesha R Bryant
*Assistant Examiner*—Tucker Wright
(74) *Attorney, Agent, or Firm*—Davis Wright Tremaine LLP

(57) ABSTRACT

NAND arrays of memory cells are described, as well as methods of forming and using them. Memory cell charge storage devices, such as conductive floating gates, are oriented vertically in trenches, with control gates positioned both in the trenches between charge storage elements and over a horizontal surface between the trenches. Individual charge storage devices are therefore field coupled with two control gates, one on either side.

17 Claims, 13 Drawing Sheets

U.S. PATENT DOCUMENTS

| | | | |
|---|---|---|---|
| 6,222,762 B1 | 4/2001 | Guterman et al. | |
| 6,232,632 B1 | 5/2001 | Liu | |
| 6,248,633 B1 | 6/2001 | Ogura et al. | |
| 6,255,689 B1 | 7/2001 | Lee | |
| 6,281,075 B1 | 8/2001 | Yuan et al. | |
| 6,512,263 B1* | 1/2003 | Yuan et al. | 257/316 |
| 6,522,580 B2 | 2/2003 | Chen et al. | |
| 6,738,289 B2 | 5/2004 | Gongwer et al. | |
| 6,815,758 B1 | 11/2004 | Chang et al. | |
| 6,820,148 B1 | 11/2004 | Cedar et al. | |
| 6,850,441 B2 | 2/2005 | Mokhlesi et al. | |
| 6,888,755 B2 | 5/2005 | Harari | |
| 6,925,007 B2 | 8/2005 | Harari et al. | |
| 6,936,887 B2 | 8/2005 | Harari et al. | |
| 6,952,034 B2 | 10/2005 | Hu et al. | |
| 6,968,421 B2 | 11/2005 | Conley | |
| 7,049,652 B2 | 5/2006 | Mokhlesi et al. | |
| 7,075,823 B2 | 7/2006 | Harari | |
| 7,114,659 B2 | 10/2006 | Harari et al. | |
| 7,152,801 B2 | 12/2006 | Cuellar et al. | |
| 7,250,340 B2 | 7/2007 | Swift et al. | |
| 2003/0109093 A1 | 6/2003 | Harari et al. | |
| 2003/0137877 A1 | 7/2003 | Mokhlesi et al. | |
| 2003/0185073 A1 | 10/2003 | Kim et al. | |
| 2005/0045940 A1 | 3/2005 | Chen et al. | |
| 2005/0072999 A1* | 4/2005 | Matamis et al. | 257/314 |
| 2005/0085040 A1 | 4/2005 | Forbes | |
| 2005/0087796 A1 | 4/2005 | Jung | |
| 2005/0151185 A1 | 7/2005 | Jung | |
| 2005/0230483 A1 | 10/2005 | Miller et al. | |
| 2005/0230484 A1 | 10/2005 | Cuellar et al. | |
| 2005/0250335 A1* | 11/2005 | Huang et al. | 438/700 |
| 2005/0255647 A1 | 11/2005 | Forbes | |
| 2005/0259467 A1 | 11/2005 | Forbes | |
| 2005/0269626 A1 | 12/2005 | Forbes | |
| 2006/0033144 A1 | 2/2006 | Forbes et al. | |
| 2006/0163644 A1* | 7/2006 | Bhattacharyya | 257/316 |
| 2006/0171209 A1* | 8/2006 | Sim et al. | 365/189.01 |
| 2006/0220093 A1 | 10/2006 | Van Schaijk et al. | |
| 2006/0245245 A1 | 11/2006 | Mokhlesi et al. | |
| 2007/0032025 A1 | 2/2007 | Brunco | |
| 2007/0034963 A1 | 2/2007 | Sudo | |
| 2007/0141780 A1 | 6/2007 | Higashitani | |
| 2008/0067572 A1 | 3/2008 | Mokhlesi | |
| 2008/0070363 A1 | 3/2008 | Mokhlesi | |
| 2008/0153226 A1 | 6/2008 | Mokhlesi | |

OTHER PUBLICATIONS

Book edited by Brown and Brewer, "Nonvolatile Semiconductor Memory Technology," IEEE Press, section 1.2, pp. 9-25 (1998).

Kamiya et al., "EPROM Cell with High Gate Injection Efficiency," IEDM Technical Digest, 1982, pp. 741-744.

Ogura et al., "Low Voltage, Low Current, High Speed Program Step Split Gate Cell with Ballistic Direct Injection for EEPROM/Flash", IEDM 1998, pp. 987-990.

Hayashi et al., "Twin MONOS Cell with Dual Control Gates," 2000 Symposium on VLSI Technology Digest of Technical Papers, Jun. 13-15, 2000, Honolulu, HI, pp. 122-123.

IBM Corporation, "Vertical EEPROM Cell," IBM Technical Disclosure Bulletin, vol. 35, No. 4B, Sep. 1992, pp. 130-131.

Jung et al., "Patterning With Spacer for Expanding the Resolution Limit of Current Lithography Tool," Design and Process Integration for Microelectronic Manufacturing IV, edited by Alfred K. K. Wong, Proc. SPIE, vol. 6156, 61561J, 2006, 9 pages.

Ogura et al., "A Novel Step Stack NOR Cell for Low Voltage Flash," 1998 Symposium on VLSI Technology Digest of Technical Papers, Jun. 9-11, 1998, pp. 106-107.

Saito et al., "Split Gate Cell with Phonon Assisted Ballistic CHE injection," 2000 Symposium on VLSI Technology Digest of Technical Papers, Jun. 13-15, 2000, Honolulu, HI, pp. 126-127.

Stanley Wolf Ph.D., "Silicon Processing for the VLSI Era," vol. 3: The Submicron MOSFET, Lattice Press, 1995, pp. vi-xxii, 595-598, 608-611, 634-638, total 32 pages.

Groeseneken et al., "Basics of Nonvolatile Semiconductor Memory Devices." Nonvolatile Semiconductor Memory Technology. A Comprehensive Guide to Understanding and Using NVSM Devices. Edited by William D. Brown, 1998, pp. 1-25.

USPTO, "Office Action," corresponding U.S. Appl. No. 11/614,894 on Sep. 25, 2008, 24 pages.

Streetman et al., *Solid State Electronic Devices*, 5$^{th}$ Ed., Prentice Hall 2000, pp. 1,3 & 252.

USPTO, "Office Action," corresponding U.S. Appl. No. 11/614,894 on Jun. 10, 2009, 20 pages.

USPTO, "Notice of Allowance," corresponding to U.S. Appl. No. 11/614,894 on Sep. 30, 2009, 13 pages.

* cited by examiner

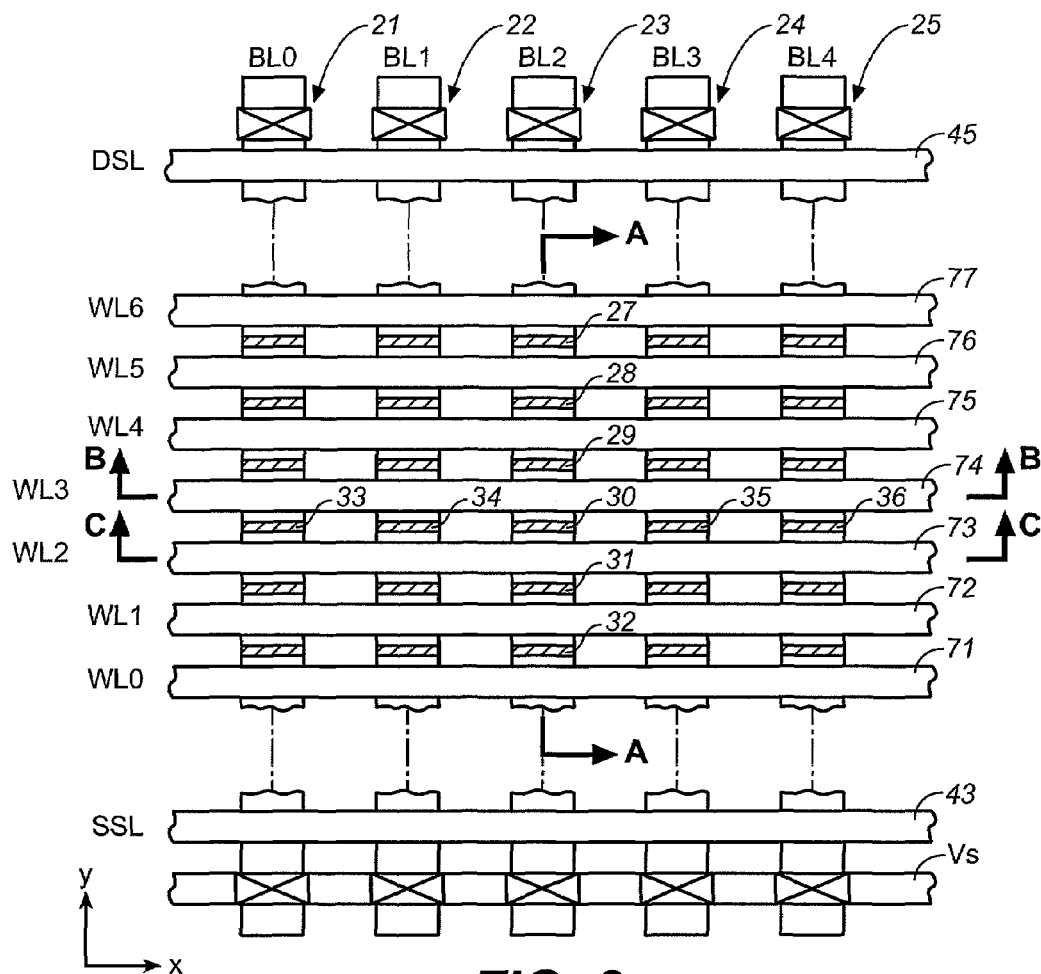
FIG. 2
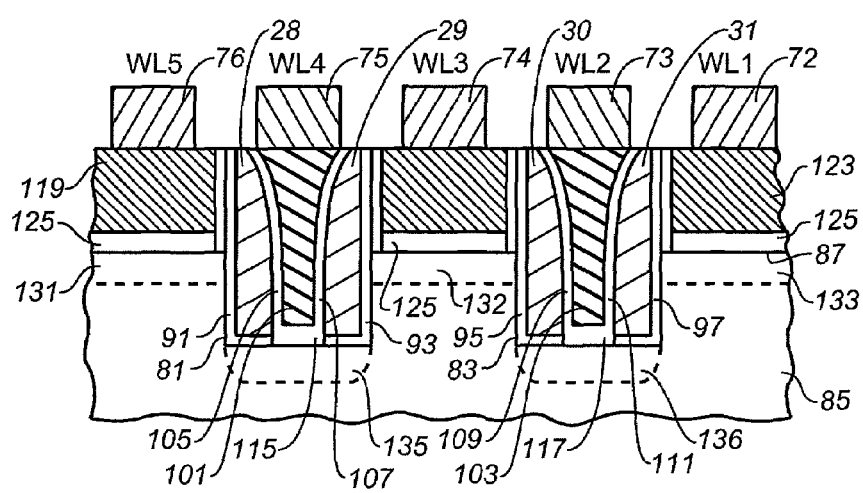
FIG. 3 (Section A-A)

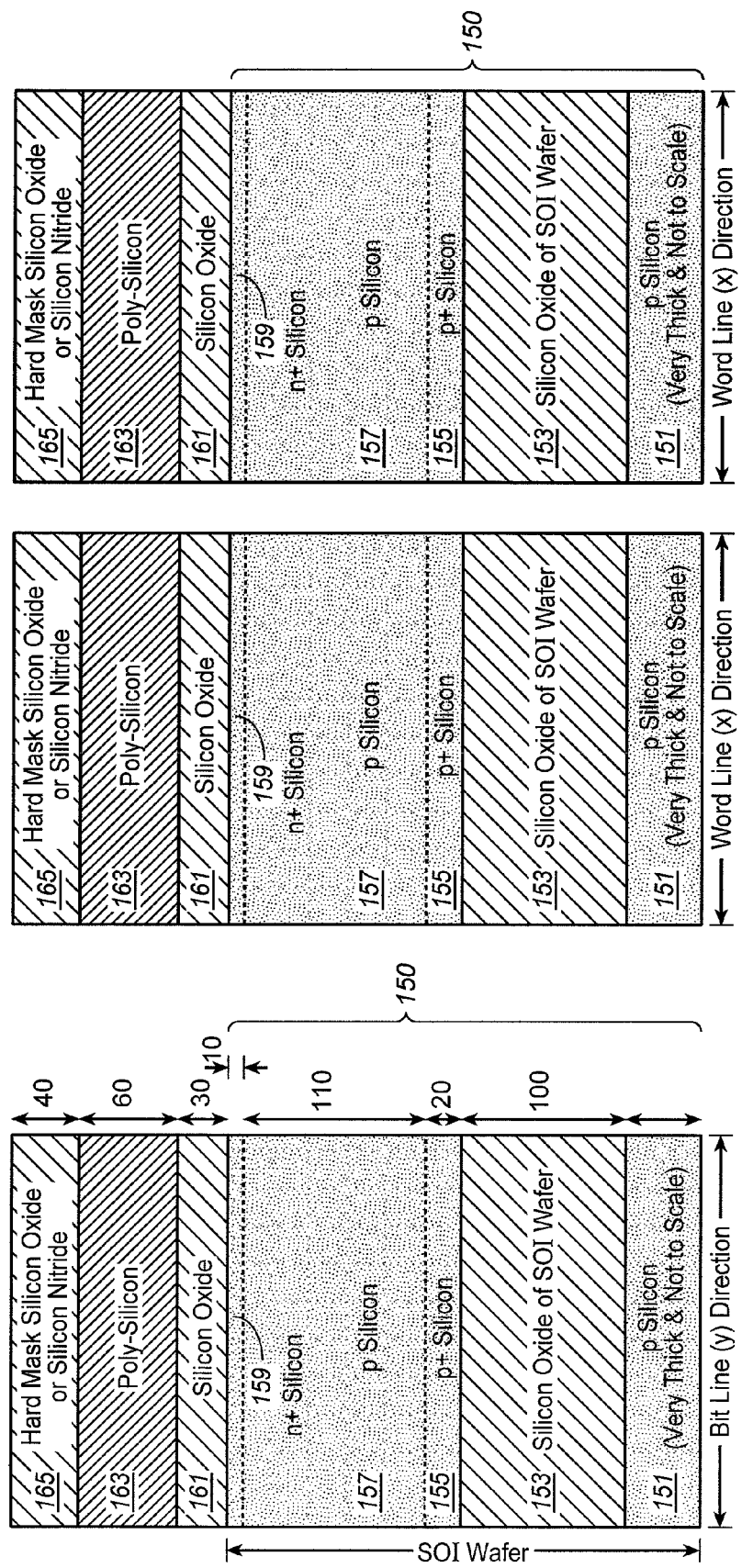

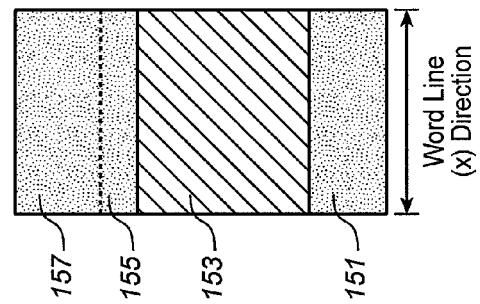
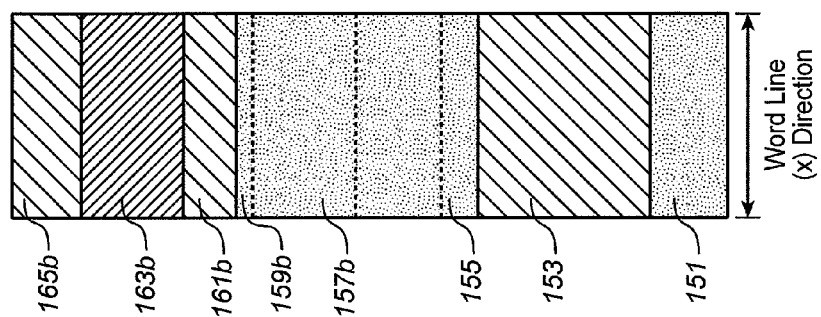
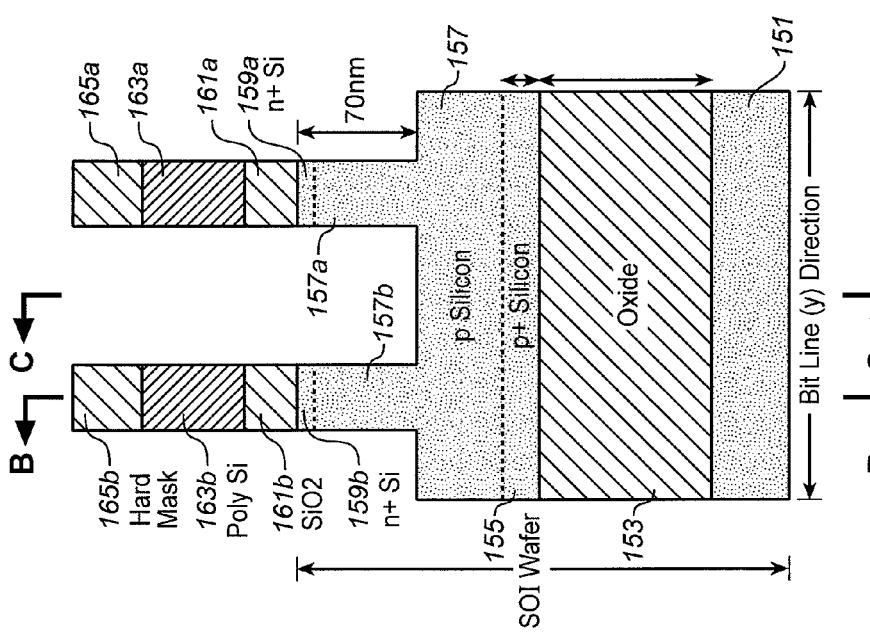

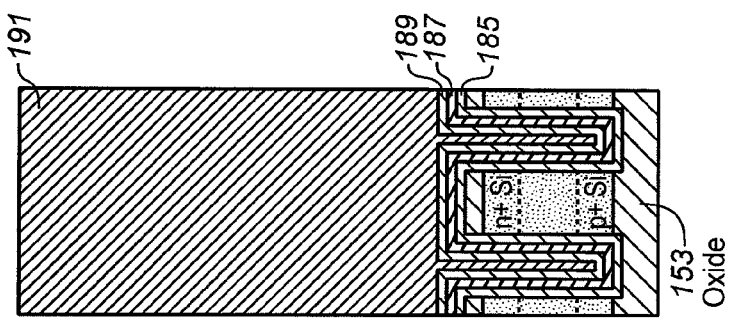
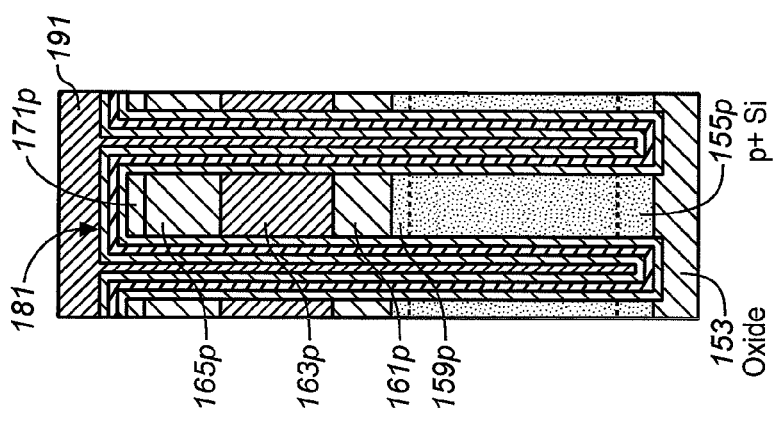
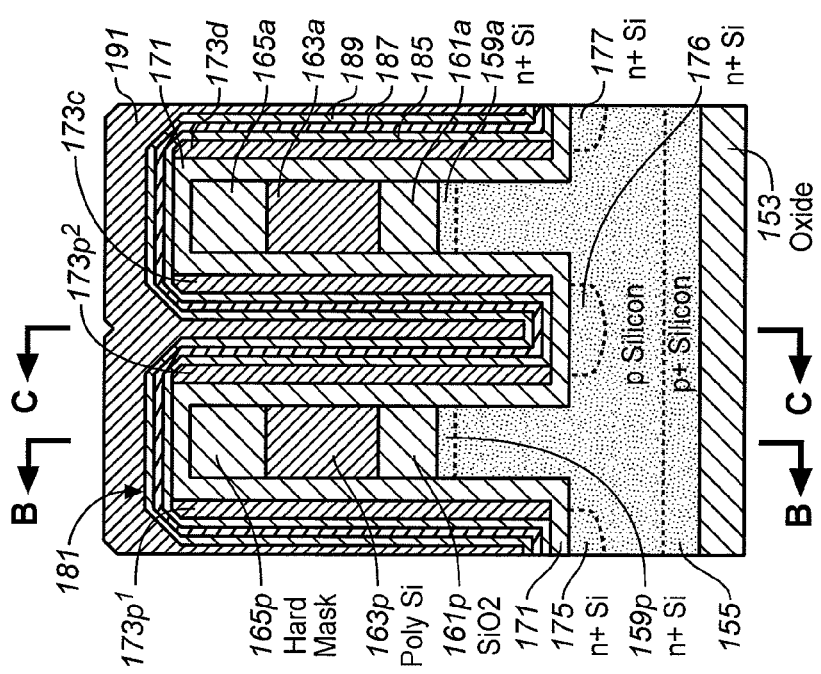

FLASH NAND MEMORY CELL ARRAY WITH CHARGE STORAGE ELEMENTS POSITIONED IN TRENCHES

CROSS-REFERENCE TO RELATED PATENTS AND APPLICATIONS

This application is related to concurrently filed application entitled "Method of Forming a Flash NAND Memory Cell Array With Charge Storage Elements Positioned in Trenches" by Nima Mokhlesi, filed Dec. 21, 2006, U.S. Publication No. 2008/0153226 A1, which is incorporated herein in its entirety by this reference.

This application is related to U.S. applications Ser. Nos. 11/533,313, U.S. Publication No. 2008/0067572 A1 and 11/533,317, U.S. Publication No. 2008/0070363 A1, of Nima Mokhlesi, both filed Sep. 19, 2006.

This application is also related to U.S. Pat. Nos. 6,888,755 and 7,075,823 of Eliyahou Harari.

BACKGROUND

This invention relates generally to non-volatile flash memory systems, and, more specifically, to a memory cell structure and process of forming arrays of memory cells that utilize trenches to reduce the overall size of the arrays.

There are many commercially successful non-volatile memory products being used today, particularly in the form of small form factor cards, which use an array of flash EEPROM (Electrically Erasable and Programmable Read Only Memory) cells. Arrays with either a NOR or a NAND architecture are commonly used. One or more integrated circuit chips containing a memory cell array are commonly combined with a controller chip to form a complete memory system. Alternatively, part or all of the controller function may be implemented on the same chip that contains all or part of the memory cell array.

A memory cell array with the NAND architecture utilizes series strings of more than two memory cells, such as 16 or 32, connected along with one or more select transistors between individual bit lines and a reference potential to form columns of cells. Word lines extend over the memory cells in a row direction, across a large number of these columns. An individual cell within a column is read and verified during programming by causing the remaining cells in the string to be turned on hard so that the current flowing through a string is dependent upon the level of charge stored in the addressed cell. Examples of NAND architecture arrays and their operation as part of a memory system are found in U.S. Pat. Nos. 5,570,315, 5,774,397, 6,046,935, 6,522,580, 6,888,755 and 6,925,007.

There are various programming techniques for causing electrons to travel through the gate dielectric from the semiconductor base structure and onto the charge storage element. The most common programming mechanisms are described in a book edited by Brown and Brewer, "Nonvolatile Semiconductor Memory Technology," IEEE Press, section 1.2, pages 9-25 (1998), where the charge storage elements are conductive floating gates. One technique, termed "Fowler-Nordheim tunneling" (section 1.2.1), causes electrons to tunnel through the floating gate dielectric under the influence of a high field that is established thereacross by a voltage difference between the control gate and the semiconductor structure channel. Another technique, channel hot electron injection in the drain region, commonly referred to as "hot-electron injection" (section 1.2.3), injects electrons from the cell's channel into a region of the floating gate adjacent the cell's drain. Yet another technique, termed "source side injection" (section 1.2.4), controls the semiconductor structure surface electrical potential along the length of the memory cell channel in a manner to create conditions for electron injection in a region of the channel away from the drain. Source side injection is also described in an article by Kamiya et al., "EPROM Cell with High Gate Injection Efficiency," IEDM Technical Digest, 1982, pages 741-744, and in U.S. Pat. Nos. 4,622,656 and 5,313,421. In a further programming technique, termed "ballistic injection" high fields are generated within a short channel to accelerate electrons directly onto the charge storage element, as described by Ogura et al., "Low Voltage, Low Current, High Speed Program Step Split Gate Cell with Ballistic Direct Injection for EEPROM/Flash", IEDM 1998, pages 987-990."

Charge is removed from charge storage elements to erase the memory cells. According to one technique, the memory cells are erased to the base semiconductor structure by applying appropriate voltages to the source, drain, semiconductor structure and other gate(s) to cause electrons to tunnel through a portion of a dielectric layer between the charge storage elements and the base structure. A large number of memory cells are grouped together into blocks of a minimum number of cells that are simultaneously erased, in a "flash." Individual blocks can store a number of pages of data, each page containing one more host sectors' worth of data. The pages are individually programmable and readable. Examples of operating large block memories are given in U.S. Pat. No. 6,968,421.

Currently, electrically conductive floating gates are the most popular form of charge storage elements used in the memory cells. But some flash memories utilize a non-conductive dielectric material that traps electrons. In either case, an individual memory cell includes one or more charge storage elements. Examples of the use of dielectric are described in U.S. Pat. No. 6,925,007 and documents referenced therein. In the case of a dielectric trapped charge memory cell, two or more charge storage elements may be formed as two or more regions of a single continuous layer of dielectric that are spaced apart thereacross. One example of a suitable charge storage dielectric material is a three-layer oxide-nitride-oxide (ONO) composite. Another example is a single layer of silicon rich silicon dioxide material.

As in almost all integrated circuit applications, the pressure to shrink the area required to implement some integrated circuit function also exists with flash EEPROM systems. It is continually desired to increase the amount of digital data that can be stored in a given area of a silicon structure, in order to increase the storage capacity of a given size memory card and other types of packages, or to both increase capacity and decrease size. Another way to increase the storage density of data is to store more than one bit of data per memory cell. This is accomplished by dividing a window of a memory cell threshold voltage range into more than two ranges. The use of four such ranges allows each charge storage element to store two bits of data, eight ranges stores three bits of data per charge storage element, and so on. A multiple state flash EEPROM structure and operation is described in U.S. Pat. Nos. 5,043,940 and 5,172,338, as examples.

Some binary memory systems designate the erased state as a data logical "0", with a programmed state being designated to be a logical "1". Other binary systems follow an opposite convention, the erased state being designated to be a "1" and the programmed state to be a "0". In a multi-state system, one having four states per storage element for example, the erased state may be designated as "00" and a maximally programmed state as "11". Others may reverse these designations.

SUMMARY

An array of memory cells is formed with the use of trenches or cavities in which the charge storage elements are positioned along sidewalls thereof and extended upwards a distance out of the trenches. Control gates are positioned between adjacent charge storage elements in one direction across the array, alternately in the trenches and in spaces between the trenches. In one example, the control gates are connected to conductors extending in an orthogonal direction across the array. In a NAND array, a plurality of such memory cells are connected in series in the one direction, the series string being connectable between one of multiple bit lines and a common potential, and the control gate conductors that extend in an orthogonal direction function as word lines.

The charge storage elements are most commonly conductive floating gates that remain within the area of the trenches in plan view. Spacers may be used as the floating gates, wherein a layer of floating gate material, such as conductively doped polysilicon, is isotropically deposited over the array and into the trenches, followed by anisotropically etching away all of the deposited floating gate material except for spacers that remain along the trench sidewalls. Conductive control gates can then be formed in the trenches between the floating gate spacers and in spaces between the trenches, so that the floating gates are individually field coupled with a pair of control gates on opposite sides of the floating gate. The extension of the floating gates out of the trenches allows such coupling with the control gates positioned between the trenches to be made and controlled.

An overall advantage of this structure is its efficient use of the surface area of a wafer or other base semiconductor structure. A significant portion of the length of the memory cell channel is vertically oriented along the trench walls, thus reducing the amount of surface area required for each memory cell.

Various aspects, advantages, embodiments and features of the present invention are included in the following description of exemplary examples thereof, whose description should be taken in conjunction with the accompanying drawings.

All patents, patent applications, articles, specifications, standards, book portions, other publications, documents and things referenced herein are hereby incorporated herein by this reference in their entirety for all purposes. To the extent of any inconsistency or conflict in the definition or use of terms between any of the incorporated publications, documents or things and the present application text, those of the present application text shall prevail.

BRIEF DESCRIPTION OF THE DRAWINGS

FIG. 2 is a plan view of a portion of a NAND memory cell array of the memory system of FIG. 1;

FIG. 3 is a sectional view of the NAND memory cell array of FIG. 2 according to a general first embodiment, taken at section A-A thereacross;

FIGS. 5-13 illustrate successive steps in a process of making the NAND memory cell array of FIG. 2 according to a more specific second embodiment, views A being taken at section A-A thereacross, views B being taken at section B-B thereacross and views C being taken at section C-C thereacross;

DETAILED DESCRIPTION OF EXEMPLARY EMBODIMENTS

Memory System

Figure 1:
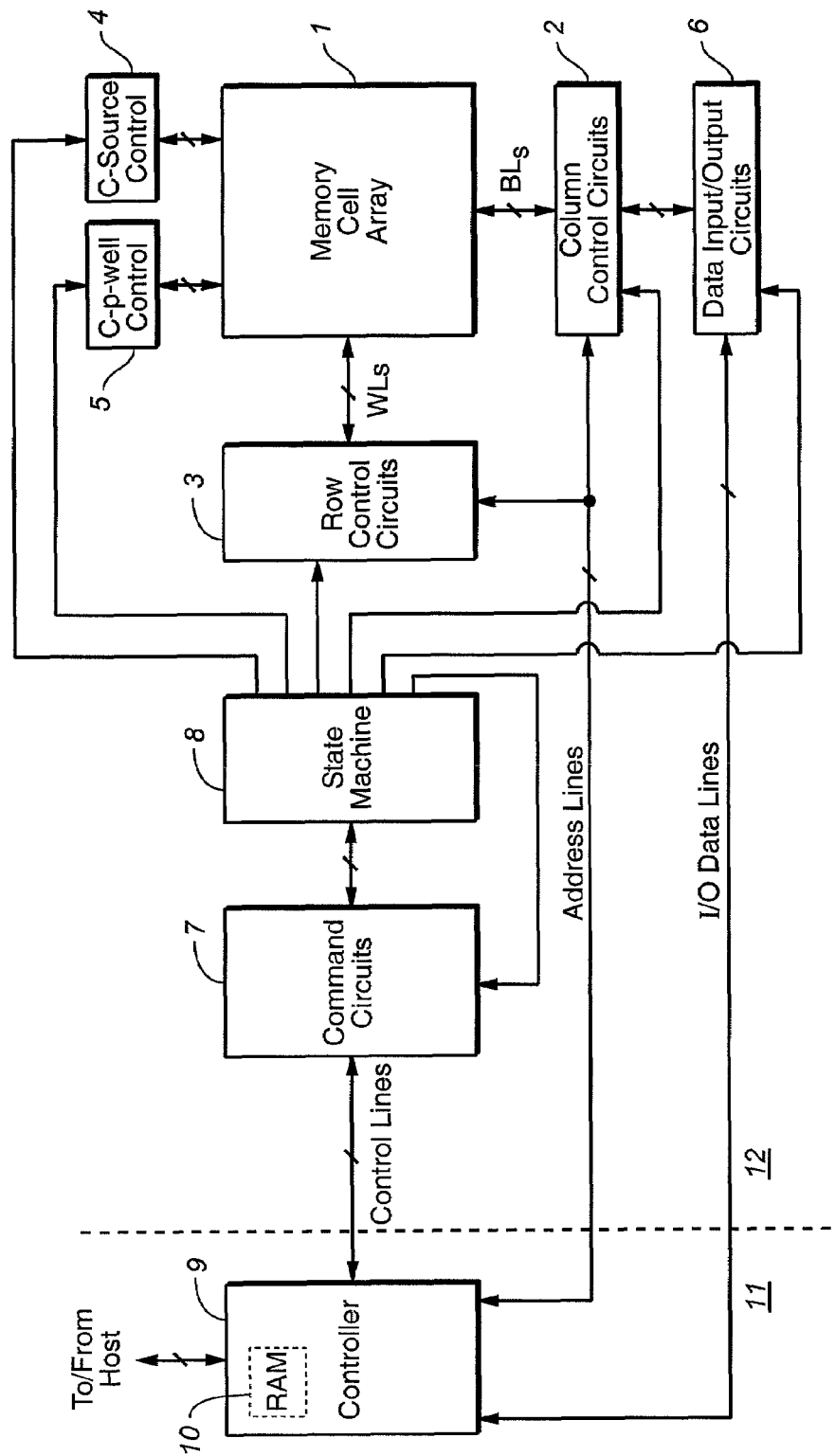
FIG. 1 illustrates in block diagram form a flash memory system.

An example memory system is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type that is described above in the Background and in references incorporated herein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to which the following voltages may be applied: read voltages, program voltages combined with the bit line potential levels controlled by the column control circuit 2, and an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

Command data for controlling the flash memory device are inputted to command circuits 7 connected to external control lines that are connected with the controller 9. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 may also output status data of the flash memory.

The controller 9 is connected or connectable with a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 11 that includes the controller 9, and one or more integrated circuit chips 12 that each contain a memory array and associated control, input/output and state machine circuits. Alternatively, the memory array and controller circuits of a system may be integrated together on one or more integrated circuit chips.

The memory system of FIG. 1 may be embedded as part of the host system, or may be included in a memory card or flash drive that is removably insertable into a mating receptacle of a host system. Such a card may include the entire memory system, or the controller and memory array, with associated peripheral circuits, may be provided in separate cards. Several card implementations are described, for example, in U.S. patents and published applications nos. U.S. Pat. Nos. 5,887, 145, 6,820,148, 7,114,659, 2005/0230483A1 and 2005/0230484A1.

General NAND Array Embodiment

Major components of a few memory cells of a NAND array are illustrated in plan view in FIG. 2. Five strings 21-25 of series connected memory cells are included, with six floating gate charge storage elements shown in each partial string. The string 23, for example, includes floating gates 27-32. A row of charge storage elements, for example, includes floating gates 33, 34, 30, 35 and 36, one in each of the five strings 21-25. Only a small rectangular array of memory cells is illustrated for ease of explanation, thirty charge storage elements being included. Actual implementations of such an array include millions of such memory cells in thousands of NAND strings, each string normally having 16, 32 or more memory cells.

Each of the NAND strings 21-25 of FIG. 2 includes two select transistors, one at each end of the string, to controllably connect the string between a different one of global bit lines BL0-BL4 and a reference potential $V_S$. $V_S$ is normally ground during read but may assume a small positive value during programming to assist in minimizing leakage across the source select transistor. A voltage $V_{SSL}$ is applied to a gate line 43 to cause select transistors at one end of the NAND strings to become conductive and connect the string ends to a common potential $V_S$. The other ends of the strings 21-25 are connected through respective select transistors to the respective bit lines BL0-BL4 by voltage $V_{DSL}$ applied to a common gate line 45. The column control circuits 2 (FIG. 1) apply a voltage to each bit line that is representative of the specific data to be written, or sense the voltage or current during a read operation.

In the NAND array shown in FIG. 2, control gate (word) lines 71-77 extend across a multiple strings of memory cells between their floating gates. The control lines are connected to the gates that are individually coupled through a suitable insulating dielectric, such as multi-layer oxide-nitride-oxide (ONO), to the floating gates on either side of the control gate lines. The control gate lines 71-77 are elongated in the x-direction across the array and separated in the y-direction by the thickness of the intervening floating gates and the thicknesses of the dielectric layers between them.

This can be seen more clearly by reference to FIG. 3, which is a cross-sectional view through a few of the memory cells of the string 23 of FIG. 2. Two trenches 81 and 83 are formed in a surface 87 of a semiconductor structure 85. The structure 85 can be a standard silicon wafer with a layer adjacent its surface 87 that is appropriately doped. Alternatively, the trenches may be formed in an epitaxial layer grown on a supporting substrate, or in a top semi-conductive layer of a silicon-on-insulator (SOI) wafer, as other examples of semiconductor base structures. An SOI wafer has a dielectric layer between a top doped layer and an underlying mechanical supporting substrate. Floating gates 28 and 29 are positioned along opposite sidewalls of the trench 81, with suitable respective dielectric layers 91 and 93 therebetween. Similarly, floating gates 30 and 31 in the trench 83 have respective layers 95 and 97 of dielectric between them and the structure 85. The trenches are preferably formed with substantially vertical side walls in at least the direction along the memory cell strings that is shown in FIG. 3.

A first set of control gates 101 and 103 is formed within respective trenches 81 and 83, separated from the floating gates on either side thereof by dielectric layers 105, 107, 109 and 111. The control gate 101 is field coupled with both of the floating gates 28 and 29. Similarly, the control gate 103 is field coupled with both of the floating gates 30 and 31. The control gates 101 and 103 are electrically connected with respective control gate lines 75 and 73. The control gates 101 and 103 are separated from bottom surfaces of their respective trenches 81 and 83 by dielectric layers 115 and 117.

A second set of control gates 119, 121 and 123 is formed between trenches along the direction of the memory cell string, over the surface 87 with a layer 125 of dielectric therebetween. These control gates are individually field coupled with the floating gates on either side of it. The control gate 121, for example, is coupled with the floating gates 29 and 30 through dielectric layers 93 and 95, which may be supplemented by an additional dielectric thickness above the surface 87, as shown. The control gates 119, 121 and 123 are electrically connected to respective control lines 76, 74 and 72. The floating gates 28-31 extend out of their respective trenches 81 and 83 a distance above the surface 87, a convenient way to provide surface area that is coupled with edges of the control gates 119, 121 and 123 that are formed above the surface 87.

The control gates 101, 103 etc. of the first set are referenced herein as "strong" control gates because the level of field coupling with the floating gates on either side of them will usually, but not necessarily, be higher than the field coupling of the control gates 119, 121, 123 etc. with their adjacent floating gates. The control gates 119, 121, 123 etc. are therefore termed "weak" control gates. Factors responsible for this difference in field coupling may include differences in coupling areas between the control and floating gates, and differences in the thicknesses and electrical characteristics of the dielectric between the control and floating gates.

As can be seen from FIG. 3, a current path through a string of memory cells exists (a) along the surface 87 under the control gates 119, 121 and 123, (b) along the side walls and portions of the bottoms of the trenches 81 and 83 opposite the floating gates, and (c) along the bottoms of the trenches between the floating gates. The conductivity of this current path in region (b) is controlled by the voltage on the floating gates. This floating gate voltage depends upon the amount of electron charge stored on the individual floating gate plus a voltage coupled to the floating gate from voltages on the pair of control gates that is field coupled with each floating gate. The conductivity of regions (a) and (c) can be controlled by one of two techniques. One is to provide doped regions 131-133 by implanting ions into the surface 87 (for region (a)), preferably at an early stage before forming the trenches 81 and 83. Doped regions 135 and 136 are also formed by implanting ions in the bottom of the trenches 81 and 83 (for region (c)), at appropriate stages in the process. In this case, the dielectric layers 115, 117 and 125 under the control gates are made relatively thick in order to minimize the coupling between the control gates and regions (a) and (c). An alternative technique omits the doped regions 131-133 and 135-136 and makes the respective dielectric layers 115, 117 and 125 relatively thin so that the control gates are sufficiently coupled with regions (a) and (c) to control conduction through them by the levels of voltages on the control gates. Further, it is possible to use one of these techniques in one of the regions (a) or (c) and the other technique in the other of these regions.

The floating gates are preferably formed as spacers. One process is to first cover the surface 87 with a thick layer of dielectric, such as silicon nitride, and then form an etch mask on top of this layer with the pattern of continuous trenches extending in the x-direction. Trenches are then etched through this layer and into the surface 87. After formation of the dielectric layers 91, 93, 95 and 97 within these elongated trenches, a layer of doped polysilicon is isotropically deposited over the array area and into the trenches. This layer is then anisotropically etched back to leave continuous polysilicon spacers along sidewalls of the trenches. These continuous spacers are then separated by an etching process that results in forming individual floating gates with spaces between them in the x-direction. These spaces are between the NAND strings of FIG. 1. These spaces may later be filled with a dielectric or, alternatively, a conductive material to shield adjacent floating gates in the x-direction against electromagnetic field coupling with each other.

A first set of control gates may then be formed in the trenches, such as the control gates 101 and 103 of FIG. 3. After the floating gates are covered by a dielectric layer, such as the layers 105, 107, 109 and 111, another layer of doped polysilicon is deposited over the array area and into the trenches. Excess polysilicon outside of the trenches is then removed by etching or chemical-mechanical-planarization (CMP) to leave the control gates in the trenches. Remaining portions of the thick dielectric layer that was initially deposited before the trenches were etched is thereafter removed. Spaces are then formed between the floating gates extending out of the trenches, in the view of FIG. 3. After any necessary dielectric layers are formed on any exposed surfaces of the floating gates and on the surface 87, a second set of control gates may then be formed between the trenches, such as the control gates 119, 121 and 123 of FIG. 3. These may be formed by depositing yet another layer of doped polysilicon over the array area and into these spaces, with polysilicon outside of these regions being removed by etching or CMP. Top thin portions of the floating gates may also be removed by CMP in order to result in floating gates with more uniform thicknesses. In this case, the floating gate spacers are made higher than they are expected to be after completion of the process and the thinner top portions thereafter removed.

Further steps in the process include formation of the control gate lines 71-77. A conductive material, such as doped polysilicon, is deposited over the array area and then etched through a mask to leave the elongated strips 71-77 shown in FIGS. 2 and 3. This step may not be self-aligned with remaining portions of the structure but the structure that exists at this point in the process allows a satisfactory alignment of the mask with it.

Although doped polysilicon has been described for the floating and control gates, and for the lines connecting them, a metal may alternatively be used for some or all of them. Polysilicon is usually preferred because it can withstand the very high temperatures to which the structure is subsequently exposed during other processing steps. When a metal is used for an element, steps that take place after the metal is formed are modified so that they may be carried out at a lower temperature than the melting point of the particular metal(s) used.

As a further alternative, rather than forming floating gates as the memory cell charge storage elements, a dielectric charge trapping material may be substituted. The middle nitride layer of ONO, for example, can also be deposited by the same spacer technique as described above for the floating gates. Uniform thickness layers of oxide are formed in a manner to be on either side of the nitride spacer to provide the ONO structure. Alternatively, spacers of silicon rich silicon dioxide can be formed in the same manner as the conductive floating gates, and the dielectric layers provided on either side of the floating gates need not be formed on such dielectric spacers. As a further alternative, a five layer structure of tantalum nitride, aluminum oxide, silicon nitride, silicon oxide and silicon (TANOS) may be used to trap charge. Since charge does not migrate across the dielectric storage elements, they are preferably programmed by a technique that distributes charge over an area similar to that of the floating gates shown. Further, a dielectric charge storage medium can be added across a conductive floating gate that is shown in the drawings, thereby forming a composite charge storage element where charge is stored in both the dielectric and conductive materials.

Figure 4:
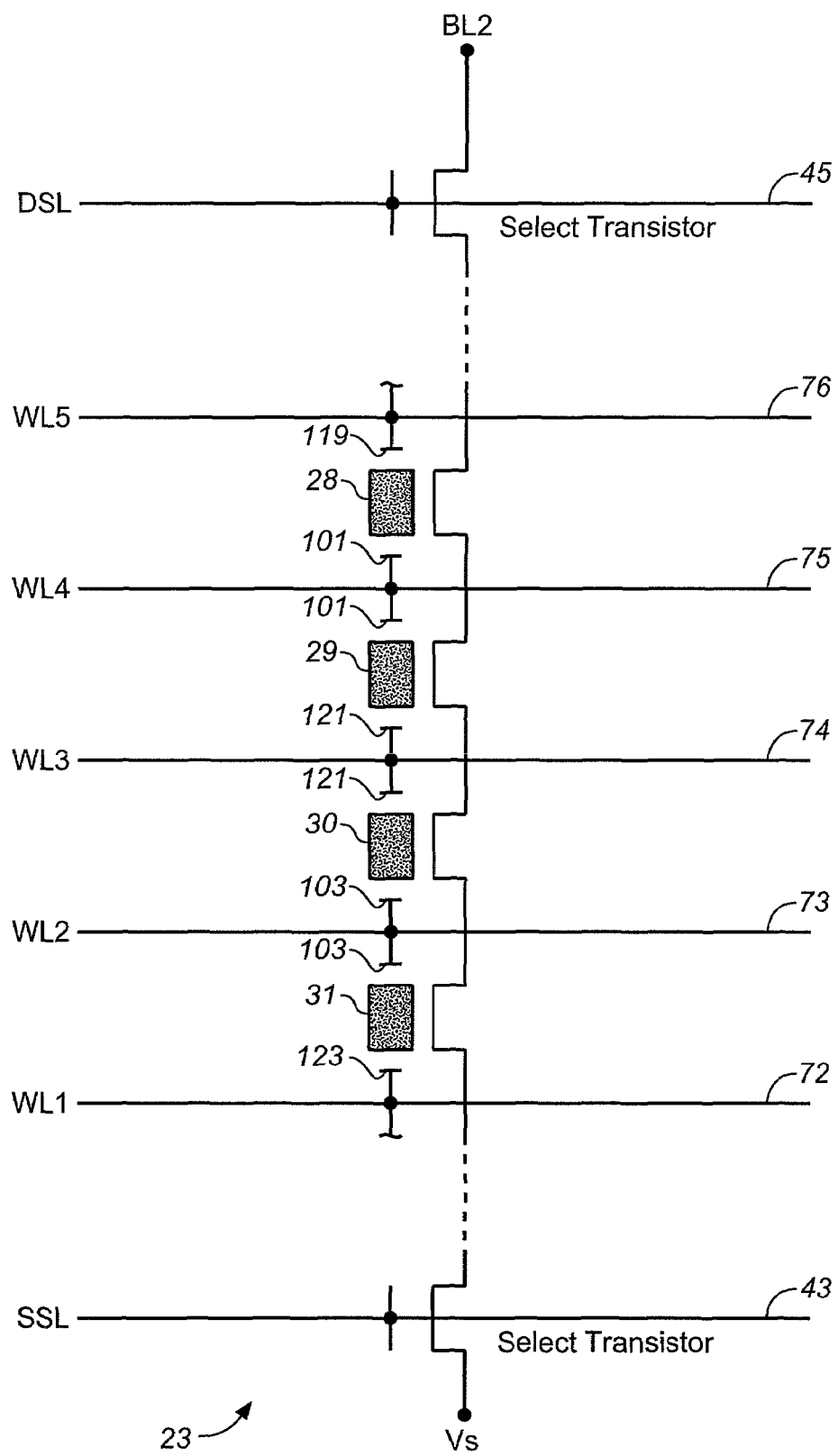
FIG. 4 is an equivalent circuit diagram of one string of memory cells in the array of FIG. 2.

An equivalent circuit for the NAND string 23 of memory cells is shown in FIG. 4. The reference numbers used in FIGS. 2 and 3 also appear in FIG. 4 to identify the same elements. Each floating gate is field coupled with one of each of the two sets of control gates, one set within the trenches and the other between the trenches, except perhaps for the floating gates at the ends of the strings. As can be seen from FIG. 3, the level of coupling between a floating gate and its two control gates may not be the same. Taking the floating gate 30 as an example, it may have a different amount of area coupled with the control gate 103 on one side than with the control gate 121 on the other side. The dielectric layers between the floating gate 30 and each of the control gates 103 and 121 can also have different thicknesses, be of different materials having different dielectric constants, or have other differences.

In one embodiment, programming the floating gates of the example memory cell system of FIGS. 1-3 may be accomplished by Fowler-Nordheim tunneling of electrons across the dielectric layers 91, 93, 95, 97 etc., which separate the channels from their associated floating gates. Electrons are injected from the vertically oriented channel surface of the semiconductor structure to the associated floating gate. Appropriate voltages are applied to at least the two control gates on opposite sides of the floating gate being programmed to cause electrons to tunnel across the channel oxide by sufficiently raising the floating gate potential to create a strong enough electric field in the channel oxide that will allow tunneling to occur. The selected cells for programming on one row of the memory array will have both their strong and weak control gates at very high voltage (e.g. 20V). The neighbor rows to the selected row share either the selected row's strong control gate or the selected row's weak control gate. The non-shared weak control gate or strong control gate of these neighbor rows should be held at ground or at a negative voltage, if such voltage level is available, in order to prevent programming on these neighbor rows. It is preferable that erase is performed through the same dielectric as programming was performed by reversing the electric field in the same dielectric. This can be achieved by holding the control gates at ground and raising the P-well to a high voltage.

Alternatively, the floating gates may be programmed by Fowler-Nordheim tunneling of electrons through the gate dielectric residing between the floating gate and the weak control gate. In this embodiment, the selected row of floating gates will have their strong control gate go to a high voltage (e.g. 20V), while their weak control gate is held at ground or, if negative voltages are available, the weak control gate may be taken to a negative voltage. Bit-line by bit-line selective programming will be achieved by boosting the NAND string channels of the cells that are to be programmed, and grounding the NAND string channels of the cells that are to be inhibited. This is in contrast to what is done when the programming is achieved by tunneling between the floating gate and the channel where boosted channels resulted in program inhibit and grounded channels resulted in programming. In the present embodiment, programming still includes raising the cell threshold voltages by inserting electrons onto the floating gates. The availability of three coupling terminals to each floating gate (namely the strong control gate, the weak control gate, and the channel) allows the continued convention of cell-by-cell programming to consist of adding electrons onto the floating gates. This is not performed in the top tunneling NAND cell which has only two coupling electrodes for each floating gate.

The top tunneling NAND cell is described in detail in U.S. patent application publication No. 2006/0245245, entitled "Non-volatile Memory Cell using High-K Material and Intergate Programming." In the memory discussed in this published application, programming on a bit-line by bit-line basis is carried out by defining programming as the act of reducing cell threshold voltages by removing electrons from the floating gates. Such a reversal of the typical definitions of programming and erasing is not necessary in the present embodiment.

Reading the level of charge on a particular floating gate of a NAND memory cell string involves rendering the paths on either side of subject floating gate conductive by applying appropriate voltages to the control gates. The subject floating gate in this embodiment is coupled with control gates on opposite sides that in turn are also coupled with other floating gates. Techniques for reading the state of such an addressed charge storage element are described in above-mentioned U.S. Pat. Nos. 6,888,755 and 7,075,823. A difference here, that may also need to be taken into account, is that the amount of coupling of the subject floating gate may be different with each of the two control gates on its opposite sides along the string. If this unequal coupling exists, different voltages will likely be applied to the control gates than if their coupling with the subject floating gate was equal.

Specific NAND Array Embodiment

FIGS. 5-15 illustrate an example process in some detail for forming the array of FIG. 2. With reference initially to the cross-sectional views of FIGS. 5A, 5B and 5C, the starting point is a silicon-on-insulator (SOI) wafer 150 that may be obtained from a wafer supplier. On a thick p-doped silicon base layer 151 is a silicon dioxide layer 153. On top of the insulating layer 153 is a silicon layer with a bottom thickness 155 that is p+ doped, a middle region 157 that is p-doped and a top layer 159 that is n+ doped, in this specific example. It is preferable to obtain the wafer from the supplier with the layer 155 already heavily p-doped, since it is difficult to implant ions to this depth from the top of the silicon layer. The n+ doping in the top layer 159 of the SOI layer may be done either by the wafer supplier or by the user who is forming a memory cell array on the wafer. Layer thicknesses are shown in FIGS. 5A and 6A in nanometers (nm) for a very specific example but other thicknesses can also be used.

FIG. 5A is a cross-section through one of the NAND strings of memory cells of FIG. 2, at section A-A thereof, FIG. 5B along one word line, at section B-B of FIG. 2, and FIG. 5C is a cross-section along another word line, at section C-C thereof. At the stage of the process illustrated in FIGS. 5A-B, all three views of the structure are the same. A layer 161 of silicon dioxide has been formed on the top surface of the SOI wafer, preferably grown by thermal or radical oxidation but alternatively deposited. A layer 163 of conductive material is then deposited over the oxide layer 161. The material of the layer 163 is typically doped polysilicon, primarily because polysilicon can withstand very high temperatures to which the structure may be exposed during subsequent processing steps, but may also be a metal if the subsequent processing steps are chosen to avoid such high temperatures. On top of the conductive layer 163, a hard mask material is formed of a silicon oxide or silicon nitride material, in a layer 165.

A next series of steps, the results of which are shown in FIGS. 6A, 6B and 6C, include patterning the mask material layer 165 by a standard photolithography process to leave strips 165a and 165b elongated in the x-direction (word line direction) across the array of FIG. 2, while being spaced apart in the y-direction (bit line direction). There are, of course, a very large number of such strips, only two of which are shown for convenience. The layers under this mask are then etched through the spaces between these strips, as shown. The etching continues through the layer 159 of the SOI wafer and is stopped in about the middle of the layer 157, as best shown by FIG. 6A. The distance etched into the layer 157 is sufficient to result in trenches in the wafer with depths that provide the desired vertical channel length for the memory cells being constructed. But enough of the layer 157 is left so that n+ ion implanted regions subsequently formed at the bottom of the trenches are far enough above the p+ layer 155 so that formation of p-n junctions are avoided since they would have the potential to break down during operation of the memory.

Figure 7A:
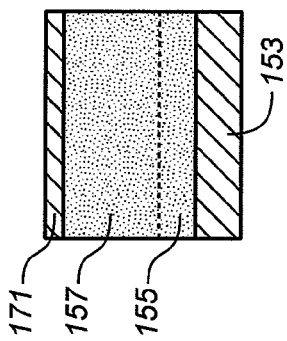
Figure 7B:
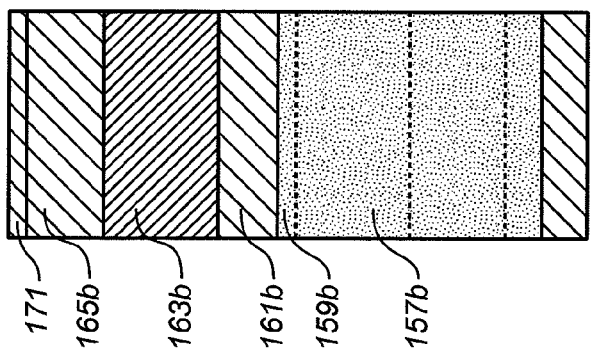
Figure 7C:
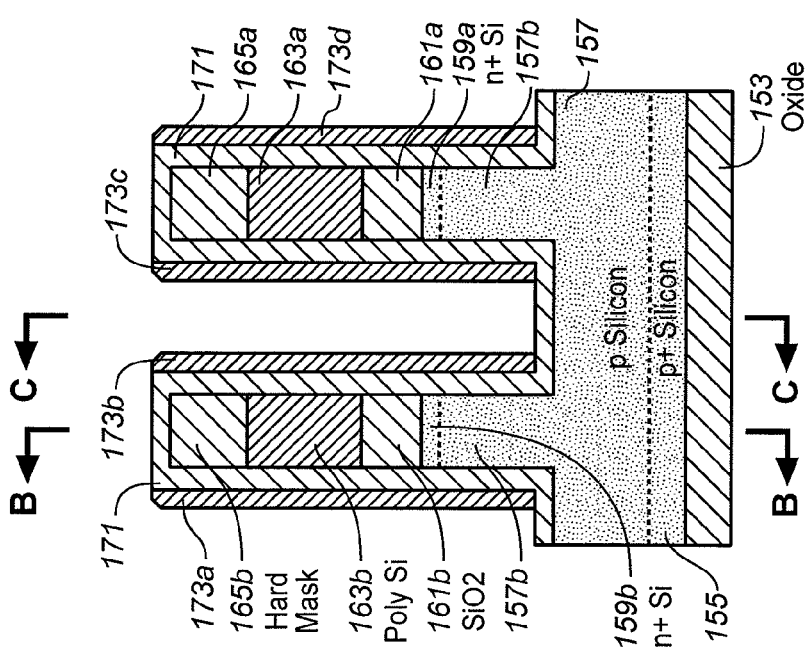

FIGS. 7A, 7B and 7C show the results of several additional processing steps. A gate oxide layer 171 is deposited over the exposed horizontal and vertical surfaces. A second conductive layer, most commonly doped polysilicon in this example but could alternatively be a metal, is then conformally deposited over the gate oxide layer to a thickness that is uniform on the horizontal and vertical surfaces (not shown). This conductive layer is then anisotropically etched to remove all of it from horizontal surfaces, thereby to leave vertically oriented strips 173a, 173b, 173c and 173d that extend continuously across the array in the x-direction (word-line direction). These strips are later separated into individual memory cell floating gates.

Figure 8C:
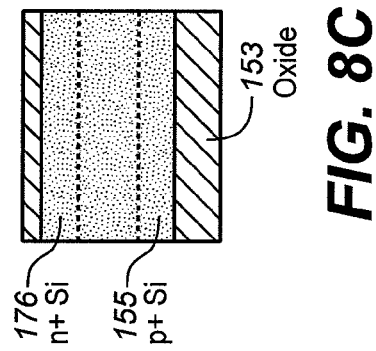
Figure 8B:
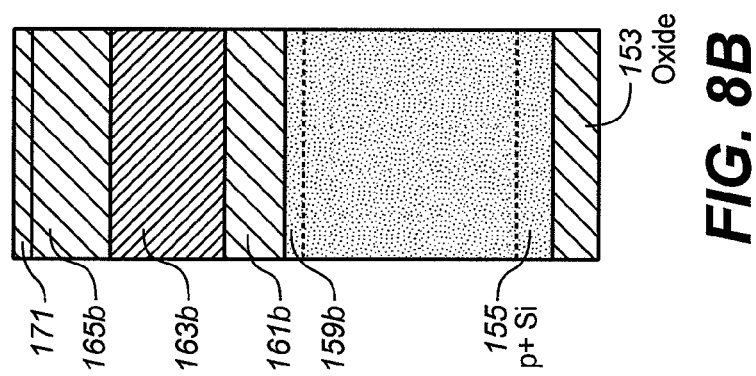
Figure 8A:
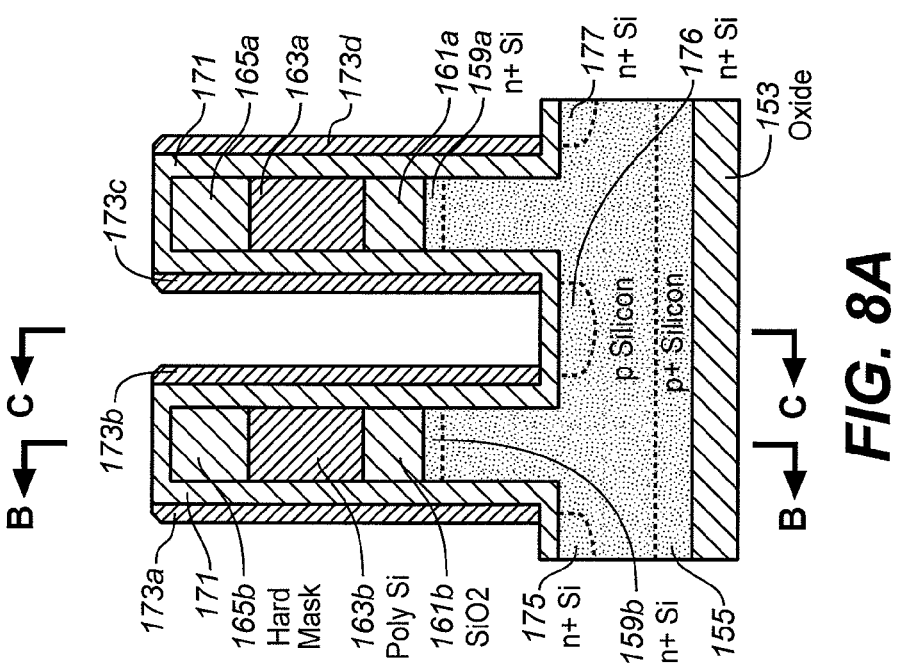

A next step, the result of which is shown in FIGS. 8A, 8B and 8C, is to implant n+ ions in regions 175, 176 and 177 along the bottoms of the trenches that are continuously elongated in the x-direction across the array. The implantation of arsenic is preferred since arsenic ions diffuse less during subsequent heating of the structure than do phosphorous ions. These n+ regions, as well as the n+ regions 159a and 159b, provide conductive paths in the semiconductor structure along NAND strings between vertical channels opposite floating gates along sidewalls of the trenches.

Figures 9A, 9B, 9C:
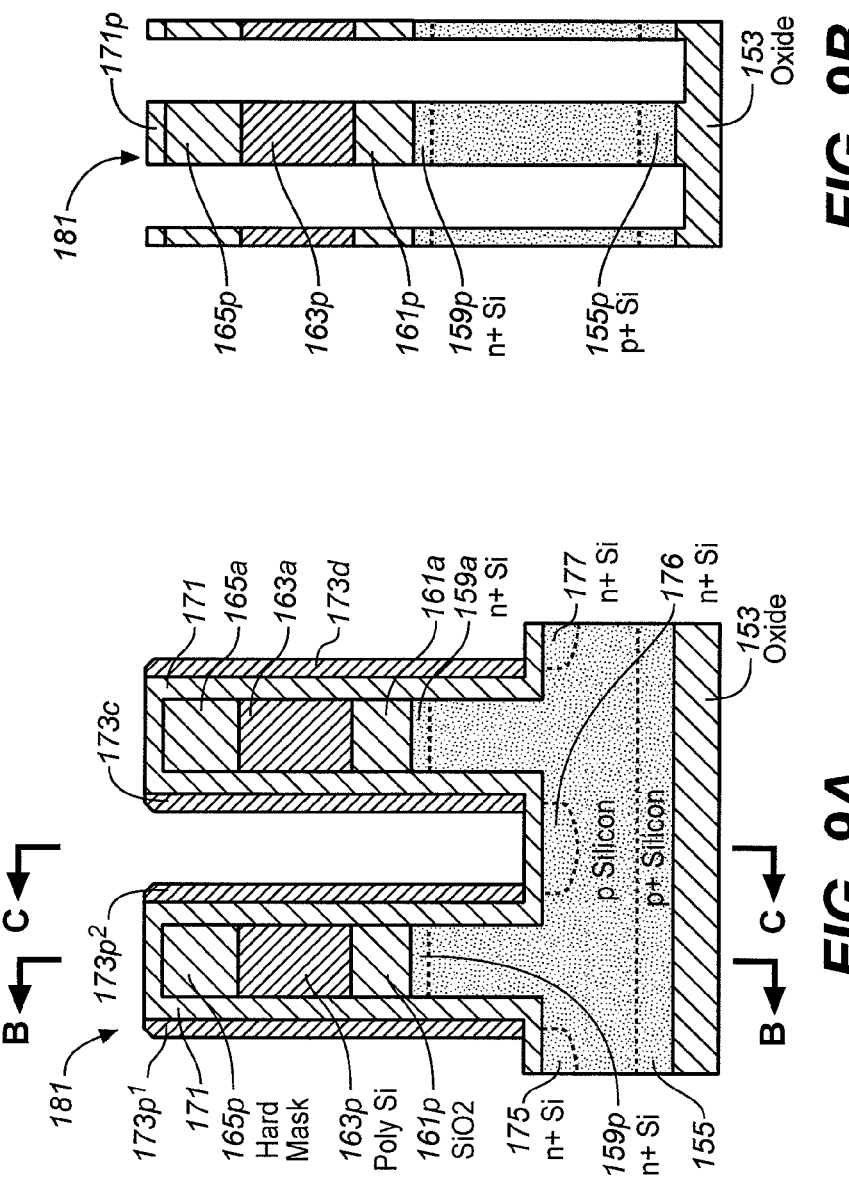

A next series of processing steps separates the elongated walls between the trenches into pillars. The result is shown in FIGS. 9A, 9B and 9C. A suitable mask (not shown) is formed across the structure of FIGS. 8A-C. This mask has strips elongated in the y-direction across the array and spaced apart in the x-direction (see the plan view of FIG. 2). Material of the structure between these mask strips is then etched away, through all layers down into the oxide layer 153 of the SOI wafer, as shown in FIGS. 9B and 9C. This isolates the NAND strings from conduction between them in the x-direction across the array. This characteristic of the SOI wafer provides very effective isolation and avoids the necessity of additional processing to do so. The result of this etching step is to form a two-dimensional array of pillars, such as pillar 181. The pillars are surrounded on all four sides by trenches. The layers of the pillar 181 are designated by the same reference numbers used for the layers on other views but with a "p" added. The first layer 165 of conductive material has now been separated into a first set of individual control gates 165*p*. The second layer 173 of conductive material has now been separated into individual floating gates 173*p*1 and 173*p*2 for the pillar 181.

Figure 10C:
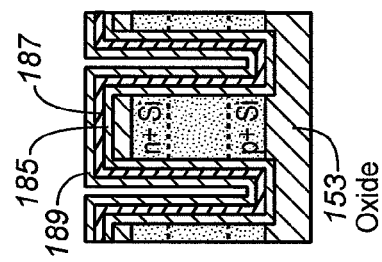
Figure 10B:
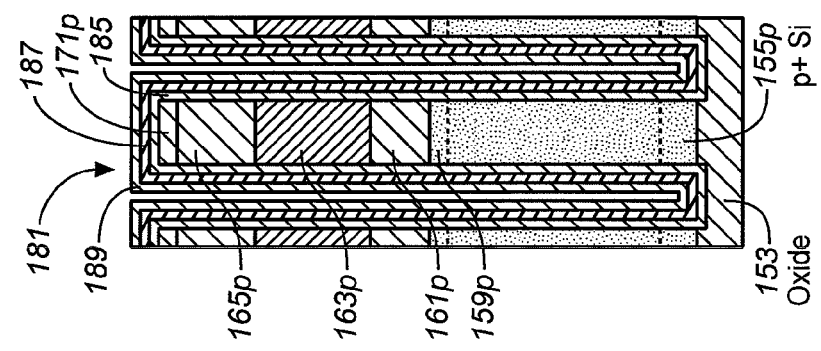
Figure 10A:
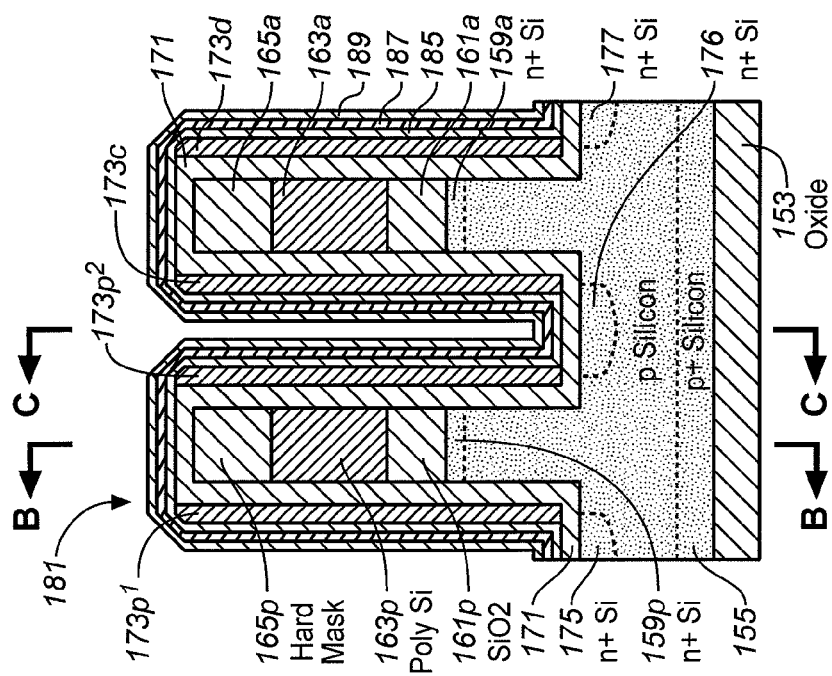

Next, a dielectric is formed over all surfaces of the array, both horizontal and vertical, including bottoms of the trenches. A preferred dielectric is a three layer oxide-nitride-oxide (ONO) structure. Referring to FIGS. 10A, 10B and 10C, an oxide layer 185 is first deposited over the array, followed by a nitride layer 187 and then another oxide layer 189.

A next step, shown in FIGS. 11A, 11B and 11C, is to deposit a third conductive layer 191 of material over the tops of the pillars and which fills in the trenches. This material may also be doped polysilicon, particularly if that has been used for the previous two conductive material depositions, but may alternatively be a metal, even if polysilicon has been used for the other conductive depositions, since fewer processing steps remain at this stage that may need to be performed at higher temperatures that a metal can withstand. The advantage of metal for the layer 191 is that it may melted immediately after being deposited in order to assure that it conforms to the vertical walls of the trenches. The purpose of this third conductive layer is to form a second set of control gates in trenches between floating gates. Once this layer is deposited, the trenches surrounding the pillars are then filled.

Figure 12C:
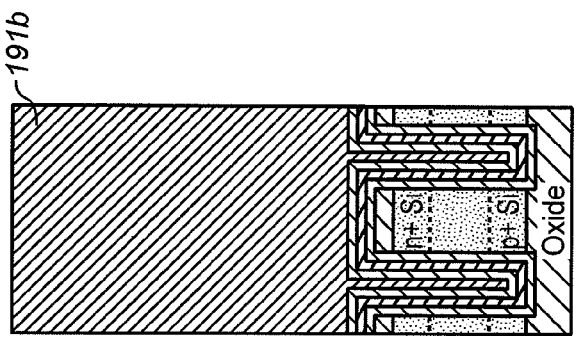
Figure 12B:
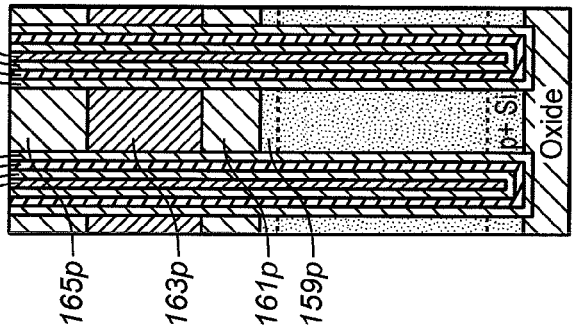
Figure 12A:
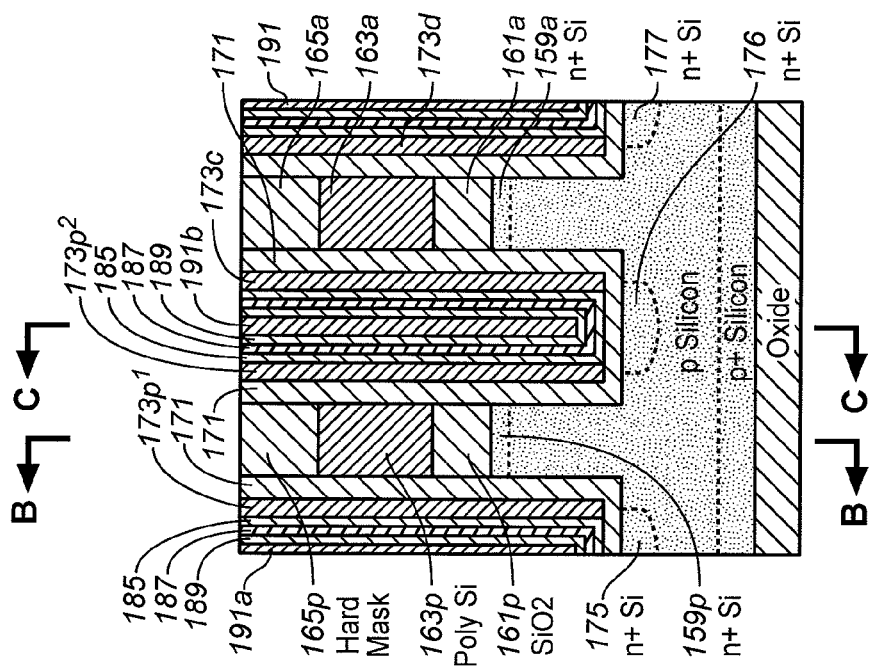

Excess amounts of the conductive layer 191 and dielectric layers under it are then removed over the entire array by chemical-mechanical-planarization (CMP). The result of the CMP step is shown in FIGS. 12A, 12B and 12C. Material is removed down to the hard mask layer 165, at which point the CMP process is stopped. Material from the third conductive layer now resides in all the trenches, surrounding the pillars.

Figure 13C:
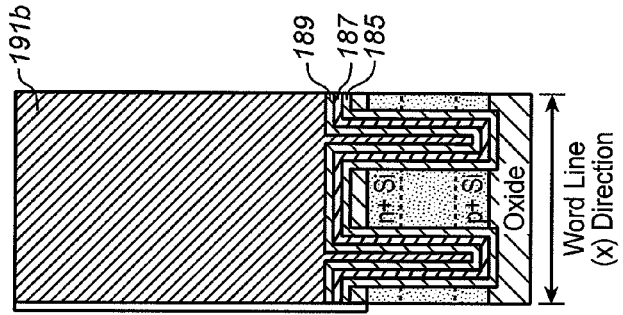
Figure 13B:
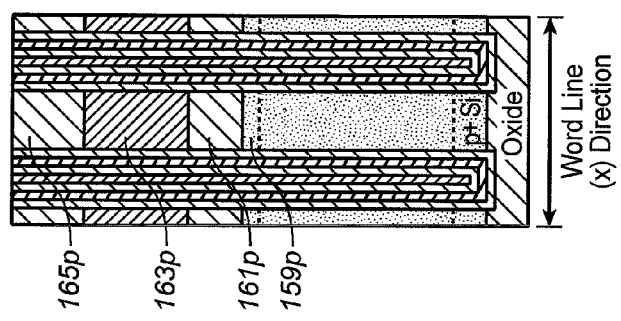
Figure 13A:
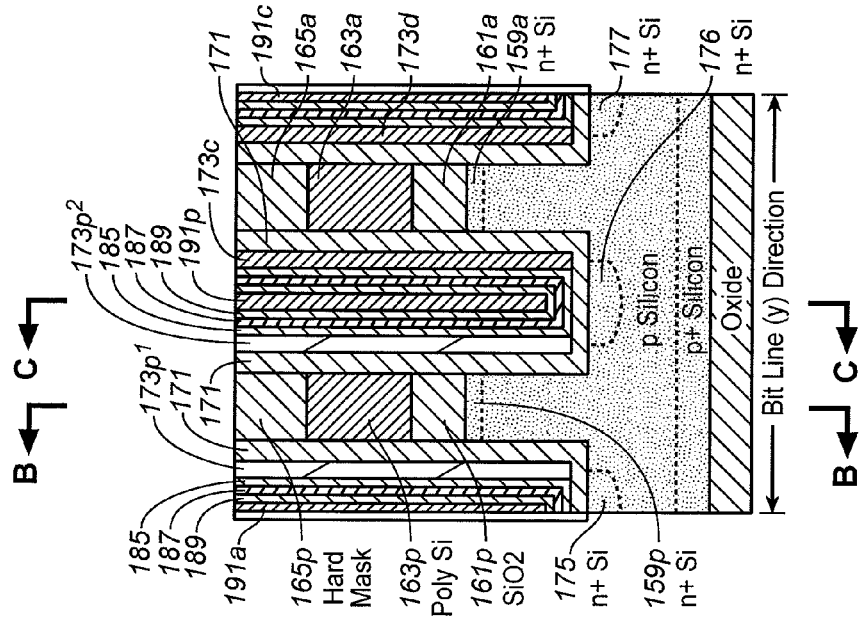

A next step is therefore to remove this conductive material between the pillars in the y-direction (in the direction of the bit lines). The result of this is shown in FIGS. 13A, 13B and 13C. Strips of a mask (not shown) are formed on the surface of the array in the state shown in FIGS. 12A, 12B and 12C to be elongated in the x-direction thereacross and spaced apart in the y-direction. The masks extend across now filled-in trenches between pillars. Portions of the conductive layer 191 between these mask strips are then etched away. This leaves the second set of control gates 191*a*, 191*b* and 191*c* in the trenches between floating gates that are connected together across the array in the x-direction to form a set of control (word) lines extending continuously across the array.

Figure 14:
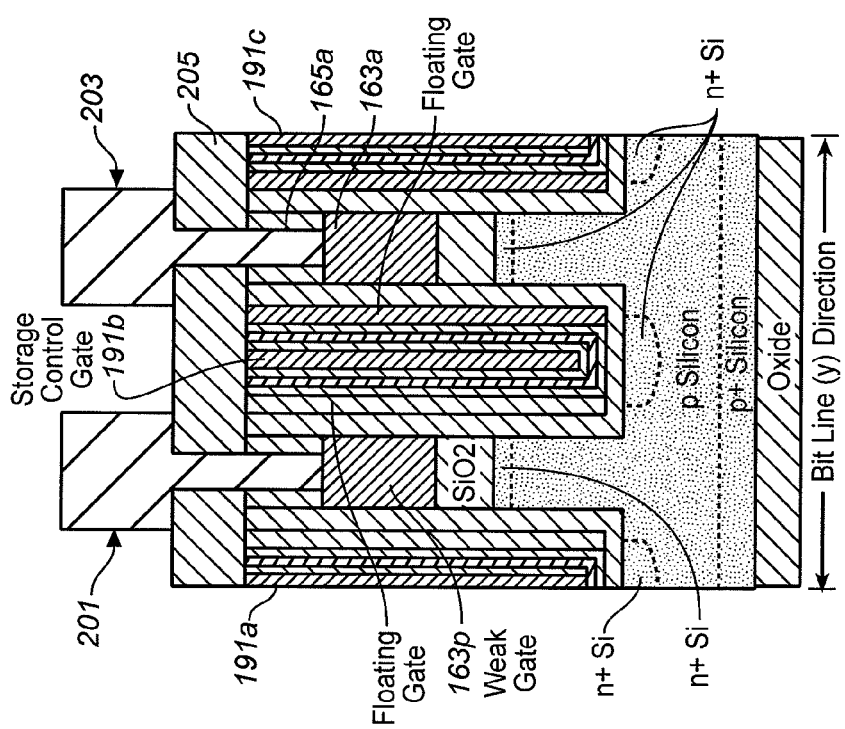
FIG. 14 is a final view of the process of making the second embodiment NAND array, taken at section A-A of FIG. 2.

The first set of control gates 163*p* of the pillars remain isolated. So, as shown in FIG. 14, they are connected by control (word) lines 201 and 203 that are also elongated in the x-direction. A layer 205 of dielectric is first formed over the array and then vias are formed through it and the mask material 165*p*. A fourth layer of conductive material, preferably a metal, is then deposited over the layer 205 and into the vias to contact the control gates 163*a*, 163*p*. The metal layer is then masked and etched to leave the control lines 201 and 203 connecting one control gate of each NAND string across the array. The dielectric layer 205 makes sure that the two sets of control lines are not shorted or fieled coupled with each other.

It will be noted that one set 163 of control gates is marked on FIG. 14 as "weak" and the other set 191 of control gates is marked as "strong." This refers to the relative level of field coupling with the charge storage elements on either side of the individual gates, as discussed above. The control gates 163 have a smaller coupling area with their adjacent floating gates than do the control gates 191, so this can cause a lower level of coupling. Also, the thicknesses and compositions of the dielectric layers between the two sets of control gates and their adjacent floating gates can be different. This coupling difference is taken into account when deciding on voltages to be applied to the two sets of control gates during programming and reading operations.

Figure 15:
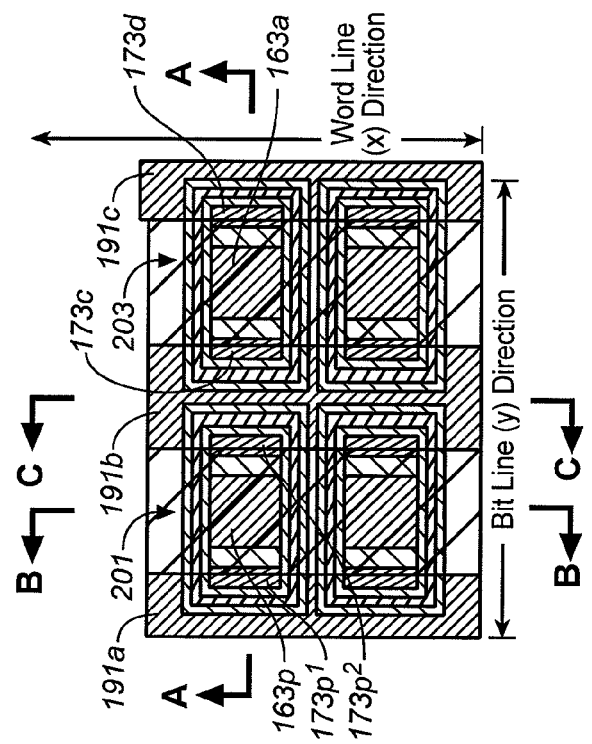
FIG. 15 is a top view of a few memory cells of the second embodiment NAND array.

A few memory cells of the array resulting from the process of FIGS. 5-14 are shown in plan view in FIG. 15. A significant advantage of this structure, and of the process of forming it, is its very compact nature. Many more floating gates can be fit into a given area of an integrated circuit. The data storage density is therefore significantly increased.

CONCLUSION

Although the various aspects of the present invention have been described with respect to exemplary embodiments thereof, it will be understood that the present invention is entitled to protection within the full scope of the appended claims.

It is claimed:
1. A non-volatile memory, comprising:
   a rectangular array of trenches extending across a surface in first and second directions that are orthogonal to each other, the individual trenches having a cross-sectional shape in the first direction including opposite sidewalls joined by a floor,
   two charge storage elements positioned within individual trenches along their opposite side walls and having portions that extend a distance outside the trenches above the surface,
   a first set of control gates positioned within individual trenches between the two charge storage elements in the first direction and connected to a first set of conductive lines having lengths extending in the second direction and being spaced apart in the first direction,
   a second set of control gates positioned over the surface between adjacent trenches in the first direction and field coupled with the portions of the charge storage elements extending out of trenches on opposite sides thereof in the first direction, the second set of control gates being connected to a second set of conductive lines having lengths extending in the second direction and spaced apart in the first direction,
   ions implanted in the floors of the trenches and in the surface between the trenches in the first direction to form source and drain regions,
   a first dielectric layer between the first set of control gates and the trench floors that field isolate the first set of control gates from the trench floors and the source and drain regions implanted therein, and
   a second dielectric layer between the second set of control gates and the surfaces between the trenches that field isolate the second set of control gates from the surfaces and the source and drain regions implanted therein.

2. The non-volatile memory of claim 1, wherein the charge storage elements include electrically conductive floating gates.

3. The non-volatile memory of claim 2, wherein the floating gates are formed as spacers from conductively doped polysilicon.

4. The non-volatile memory of claim 1, wherein the charge storage elements extend a distance outside the trenches to at least a top surface of the second set of control gates.

5. The non-volatile memory of claim 1, additionally comprising conductive shields positioned between the trenches in the second direction and extending to a depth below the surface that is at least as great as that of the array of trenches.

6. The non-volatile memory of claim 1, wherein the trenches are formed in a surface of a silicon-on-insulator (SOI) wafer.

7. A re-programmable non-volatile memory, comprising:

a rectangular array of pillars extending across a semiconductor substrate in first and second directions that are orthogonal to each other, the pillars individually comprising a vertical stack of a portion of the substrate, a conductive layer forming a first control gate and insulation therebetween, charge storage elements positioned along opposite sidewalls of individual pillars in the first direction and extending vertically along the stack, wherein the first control gate conductive layer of the individual pillars is field coupled with only a portion of a full vertical extent of the charge storage elements on the opposite sidewalls thereof, conductive material positioned in spaces between the charge storage elements of adjacent pillars in the first direction to form second control gates that are individually field coupled with substantially the full vertical extent of two charge storage elements on opposite sides thereof, a first set of conductive lines connecting the first control gate layers of individual pillars along the second direction, the first set of conductive lines having lengths extending in the second direction and being spaced apart in the first direction, a second set of conductive lines individually connecting a plurality of second control gates along the second direction, the second set of conductive lines having lengths extending in the second direction and being spaced apart in the first direction in between the first set of conductive lines, and first ion implant regions in a surface of the portions of the substrate included in the stacks of the pillars under the insulation, and second ion implant regions in surfaces of the substrate between the stacks of the pillars in the first direction, the first and second ion implant regions being characterized by allowing conduction of electrons therethrough in the first direction.

8. The memory of claim 7, wherein the charge storage elements include electrically conductive floating gates.

9. The memory of claim 8, wherein the floating gates are formed as spacers from conductively doped polysilicon by anisotropic etching without a mask.

10. The memory of claim 7, wherein the stacks of the pillars and charge storage elements positioned along opposite sidewalls thereof are electrically isolated from one another in the second direction.

11. The memory of claim 7, additionally comprising conductive shields positioned between the pillars in the second direction.

12. The memory of claim 7, wherein the pillars are formed in a surface of a silicon-on-insulator (SOI) wafer.

13. The memory of claim 7, additionally comprising a layer of dielectric between the second ion implant regions and a bottom of the second control gates sufficient to field isolate the second control gates from the second ion implant regions, and wherein the insulation in the stacks of the pillars is sufficient to field isolate the first control gates from the first ion implant regions.

14. The memory of claim 7, additionally comprising at least one control circuit connectable to select transistors at ends of strings of a series connection of a plurality of pillars extending in the first direction in a manner to cause current to flow through individual strings with a level dependent on a magnitude of the at least one voltage, voltages on the first and second control gates and a level of charge stored on at least one charge storage element of the string.

15. The memory of claim 14, wherein the charge storage elements are electrically conductive floating gates.

16. The memory of claim 15, wherein the stacks of the pillars and charge storage elements positioned along opposite sidewalls thereof are electrically isolated from one another in the second direction.

17. The memory of claim 7, additionally comprising dielectric layers in the spaces between the charge storage elements of adjacent pillars and between said conductive material and said semiconductor substrate.

* * * * *